United States Patent
Lee et al.

(10) Patent No.: US 9,366,817 B2
(45) Date of Patent: Jun. 14, 2016

(54) METHOD OF INTEGRATING ALL ACTIVE AND PASSIVE OPTICAL DEVICES ON SILICON-BASED INTEGRATED CIRCUIT

(71) Applicant: National Tsing Hua University, Hsinchu (TW)

(72) Inventors: Ming-Chang Lee, Hsinchu (TW); Chih-Kuo Tseng, Taichung (TW)

(73) Assignee: NATIONAL TSING HUA UNIVERSITY, Hsinchu (TW)

( * ) Notice: Subject to any disclaimer, the term of this patent is extended or adjusted under 35 U.S.C. 154(b) by 267 days.

(21) Appl. No.: 14/308,797

(22) Filed: Jun. 19, 2014

(65) Prior Publication Data

US 2015/0331187 A1    Nov. 19, 2015

(30) Foreign Application Priority Data

May 15, 2014   (TW) .............................. 103117237 A

(51) Int. Cl.
| | | |
|---|---|---|
| *H01L 21/00* | (2006.01) | |
| *G02B 6/136* | (2006.01) | |
| *G02B 6/13* | (2006.01) | |
| *G02B 6/43* | (2006.01) | |
| G02B 6/12 | (2006.01) | |
| H01L 31/0232 | (2014.01) | |
| H01L 27/12 | (2006.01) | |

(52) U.S. Cl.
CPC ............... *G02B 6/136* (2013.01); *G02B 6/131* (2013.01); *G02B 6/43* (2013.01); *G02B 2006/12169* (2013.01); *H01L 27/1203* (2013.01); *H01L 31/02325* (2013.01)

(58) Field of Classification Search
CPC .................... H01L 27/1203; H01L 31/02325; G02B 6/12004; G02F 1/295
See application file for complete search history.

(56) References Cited

U.S. PATENT DOCUMENTS

| | | | | |
|---|---|---|---|---|
| 6,078,707 A | * | 6/2000 | Yamamoto | ......... G02B 6/12004 257/435 |
| 6,242,324 B1 | * | 6/2001 | Kub | ....................... B82Y 10/00 257/E21.122 |
| 6,999,670 B1 | * | 2/2006 | Gunn, III | ................ G02F 1/025 385/131 |
| 7,526,146 B1 | * | 4/2009 | Hsu | ......................... G02F 1/025 385/1 |
| 9,159,635 B2 | * | 10/2015 | Elolampi | ................ H01L 23/13 |
| 2006/0177173 A1 | * | 8/2006 | Shastri | ...................... G02B 6/42 385/14 |
| 2009/0245298 A1 | * | 10/2009 | Sysak | .................... B82Y 20/00 372/22 |
| 2009/0324164 A1 | * | 12/2009 | Reshotko | ............. G02B 6/1228 385/14 |
| 2011/0222570 A1 | * | 9/2011 | Junesand | ................ H01S 5/021 372/50.1 |
| 2013/0285184 A1 | * | 10/2013 | Li | ............................ H01L 31/18 257/432 |
| 2014/0185640 A1 | * | 7/2014 | Jain | ....................... B82Y 20/00 372/45.011 |

* cited by examiner

*Primary Examiner* — Zandra Smith
*Assistant Examiner* — John M Parker
(74) *Attorney, Agent, or Firm* — Jackson IPG PLLC; Demian K. Jackson

(57) ABSTRACT

A method is provided to integrate all active and passive integrated optical devices on a silicon (Si)-based integrated circuit (IC). A Si-based substrate, instead of a Si-on-insulator (SOI) substrate, is used for integrating the devices. Therefore, cost is down and heat dissipation efficiency is enhanced. Besides, rapid melt growth (RMG) is used for solving problems on integrating the electric circuit and the optical devices. The present invention can be used to develop a proactive optical transceivers on a standard chip; or, to fully and compatibly integrate all devices on a circuit for an optical communication chip.

10 Claims, 3 Drawing Sheets

METHOD OF INTEGRATING ALL ACTIVE AND PASSIVE OPTICAL DEVICES ON SILICON-BASED INTEGRATED CIRCUIT

TECHNICAL FIELD OF THE INVENTION

The present invention relates to a silicon (Si)-based integrated circuit (IC); more particularly, relates to integrating a light source, optical passive devices, optical detectors and electronic circuits on a standard Si substrate through a producing procedure of complementary metal oxide semiconductor (CMOS).

DESCRIPTION OF THE RELATED ART

Optical signal transmission catches attention owing to its characteristics of ultrafast bandwidth and low loss rate. From traditional networks, passive optical networks, high-speed computing servers, even to a home computer, the transmission can be seen almost everywhere. In the future, optical linkage can even be used for data transmission between chips or for inter-linkage within a multi-core processor. Previously, optical communications rely more on optoelectronic III-V group semiconductors; but, relatively, the semiconductors cannot be compared with CMOS devices on material costs, production technologies and integration of high-frequency electronic circuits.

Because of the small volume and high refractive index of the Si waveguide, high-density optical integrated circuits can be achieved. Therefore, in recent years, the use of silicon germanium (SiGe) obtains significant progresses for making optical ICs, high-speed optical modulators and optical detectors, even for integrating laser light sources. Regarding technology development, companies like Intel, IBM, Luxtera are most actively involved; and research units like, IMEC, CEA-Leti and NTT invest more manpower.

Among conventional technologies, IBM has developed a chip of Si photonic linkage, where optoelectronic devices and electronic devices are integrated on a single silicon-on-insulator (SOI) chip. For now, a standard 90 nanometers (nm) technology has been applied to the SOI chip, where each Si waveguide has a data transmission rate up to 25 gigabits per second (Gbps). Yet, because SiGe does not light, IBM chooses to import light into the chip by using an external semiconductor laser, which still cannot effectively integrate light sources and reduce power consumption. Conclusively, the strategy taken by IBM is to integrate the optical devices and the electronic devices with the light source provided by the external semiconductor laser. Luxtera is a pioneer in the development of CMOS optical communication chips, whose technology is similar to IBM's. SOI is selected to be the substrate for making CMOS circuits and optoelectronic devices on Si surface, including transistors, signal modulators, optical waveguides and Ge absorbers. What makes Luxtera different from IBM is that Ge directly grows on Si through epitaxy with a more complicated procedure. Besides, Luxtera also selects an external distributed feedback (Distributed Feedback, DFB) laser light source to direct light into the device, where the inlet has a grating coupler to improve coupling efficiency of fiber. Its main application is active optical cable (Active Optical Cable); however, assembly of laser light source on the optical chip is still a major problem with cost not effectively reduced.

Thereby, the on prior arts of Si photonic chips have the following problems:

1. All devices are fabricated on SOI substrates, which are not only expensive with poor thermal conductivity; but also incompatible with standard CMOS procedures.

2. Light sources seldom use SiGe as main materials; or, extra III-V group semiconductors have to be integrated as light sources. Thus, no competitive advantage is obtained for SiGe photonic devices on production cost and packaging cost.

Hence, the prior arts do not fulfill all users' requests on actual use.

SUMMARY OF THE INVENTION

The main purpose of the present invention is to integrate a light source, optical passive devices, optical detectors and electronic circuits on a standard Si substrate through a producing procedure of CMOS.

Another purpose of the present invention is to form a single crystal or alloy layer on a Si electronic device through rapid melt epitaxy (RMG) for finishing processes of bottom-transistor activation and thin-film epitaxy of electronic devices within a few seconds because the activation temperature for Si-doping is similar to that for RMG, where the present invention are compatible with general CMOS producing procedures while thermal budget is reduced by integrating processes.

Another purpose of the present invention is to use a Si substrate to replace a SOI substrate for effectively reducing cost and improving heat dissipation, where RMG is used to integrating electronic circuits and optoelectronic devices for developing optical transceivers on a standard wafer and circuits are integrated to obtain a compatible fully integrated optical communication chip.

To achieve the on purposes, the present invention is a method of integrating all active and passive optical devices on a Si-based integrated circuit (IC), comprising steps of: (a1) providing a Si substrate; obtaining at least one electronic device on the Si substrate; and obtaining a first insulating layer to be covered on the Si substrate and the electronic device; (b1) pattern-etching the first insulating layer to form a first groove on the Si substrate; obtaining an active-layer semiconductor in the first groove and on the first insulating layer; and obtaining a second insulating layer to be covered on the active-layer semiconductor; (c1) by using RMG, obtaining a filling part and a waveguide part on the active-layer semiconductor after an annealing process to obtain a layer of a single crystal or an alloy; and obtaining an optical emitter and an optical receiver; and (d1) obtaining a third insulating layer to be covered on the optical emitter, the optical receiver, the waveguide part and the first insulating layer; after pattern-etching, obtaining a plurality of second grooves on the electronic device, the optical emitter and the optical receiver; and, through the second grooves, obtaining a plurality of metal pads on the electronic device, the optical emitter and the optical receiver for inputting and outputting electronic signals. Accordingly, a novel method of integrating all active and passive optical devices on a Si-based IC is obtained.

BRIEF DESCRIPTIONS OF THE DRAWINGS

The present invention will be better understood from the following detailed descriptions of the preferred embodiments according to the present invention, taken in conjunction with the accompanying drawings, in which FIG. 1 is the flow view showing the first preferred embodiment according to the present invention;

DESCRIPTIONS OF THE PREFERRED EMBODIMENTS

The following descriptions of the preferred embodiments are provided to understand the features and the structures of the present invention.

Figure 1:
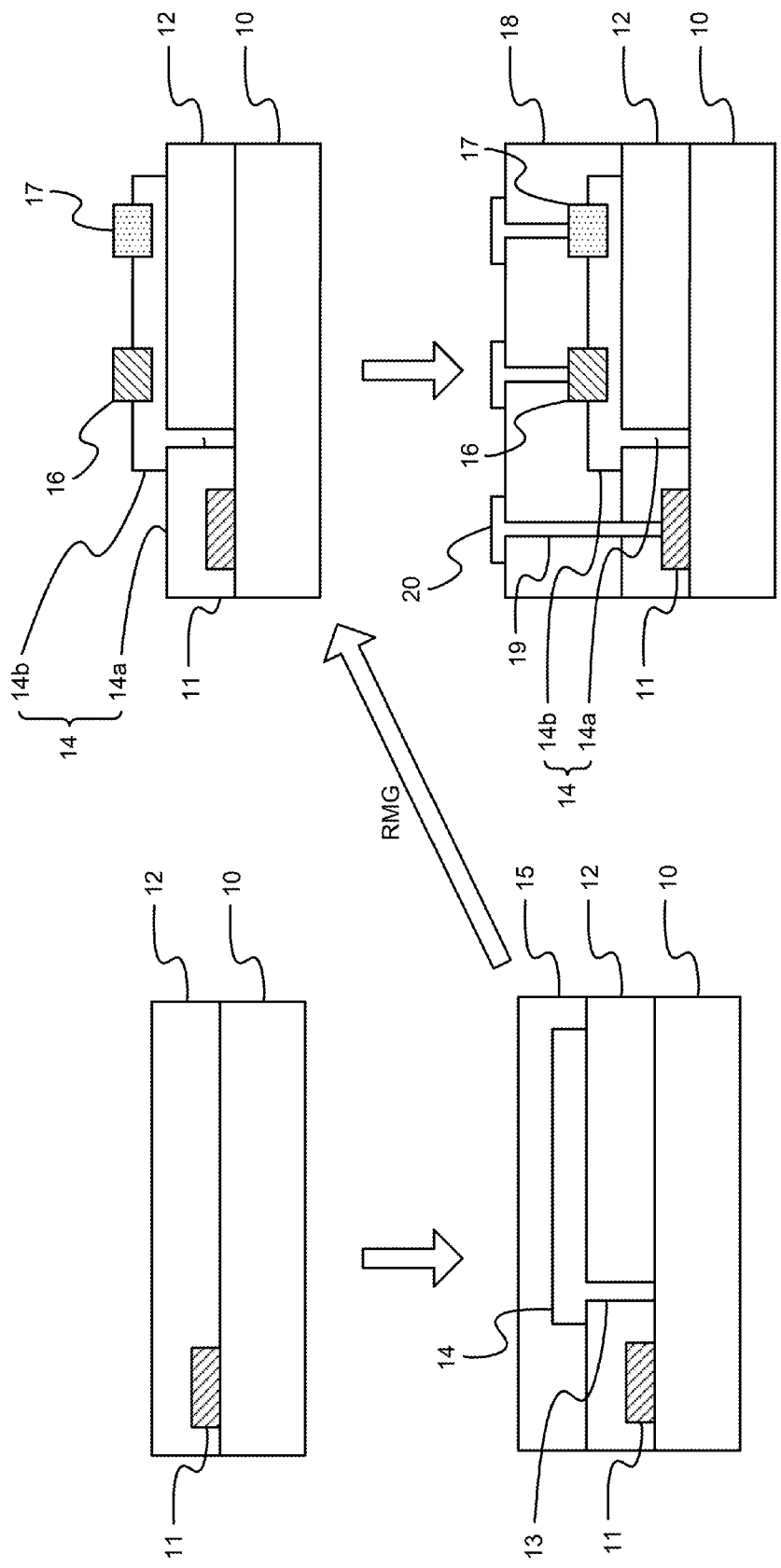
Figure 2:
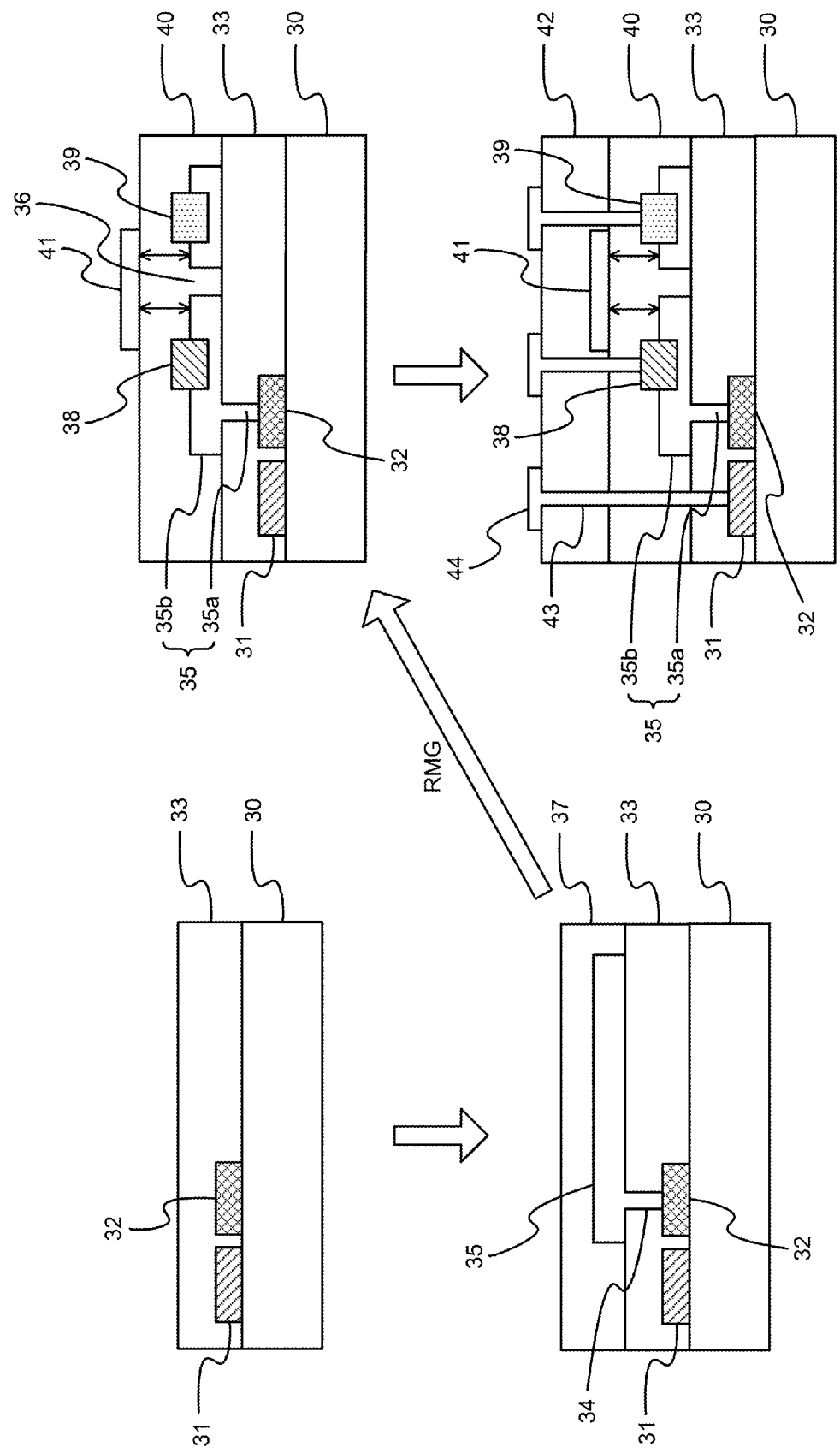
FIG. 2 is the flow view showing the second preferred embodiment.

Please refer to FIG. 1 and FIG. 2, which are views showing a first and a second preferred embodiments according to the present invention; and a view showing a state-of-use. As shown in the figure, the present invention is a method of integrating all active and passive optical devices on a Si-based IC, where a light source, optical passive devices, optical detectors and electronic circuits are integrated on a standard Si substrate through a producing procedure of complementary metal oxide semi-conductor (CMOS) without using a silicon-on-insulator (SOI) substrate.

In FIG. 1, a first preferred embodiment according to the present invention comprises the following steps:

(a1) A Si substrate 10 is provided. At least one electronic device 11 is formed on the Si substrate 10. A first insulating layer 12 is covered on the Si substrate 10 and the electronic device 11. Therein, the Si substrate 10 10 can be a polycrystalline Si substrate;

(b1) The first insulating layer 12 is pattern-etched to form a first groove 13 on the Si substrate 10. An active-layer semiconductor 14 is formed on the first groove 13 and the first insulating layer 12. A second insulating layer 15 is covered on the active-layer semiconductor 14. Therein, a material of III-V group or IV group is used to fabricate the active-layer semiconductor 14; and, the melting point ($T_{melt}$) of the second insulating layer 15 is greater than that of the active-layer semiconductor 14.

(c1) By using rapid melt epitaxy (RMG), the active-layer semiconductor 14 comprises a filling part 14a and a waveguide part 14b after an annealing process. Therein, the filling part 14a is located in the first groove 13; the waveguide part 14b is located on the first insulating layer 12 and perpendicularly connected with the filling part 14a; and, a layer of a single crystal or an alloy is thus formed on the Si substrate 10 and the at least one electronic device 11. Then, an optical emitter 16 and an optical receiver 17 are formed on the waveguide part 14b.

(d1) A third insulating layer 18 is formed to be covered on the optical emitter 16, the optical receiver 17, the waveguide part 14b and the first insulating layer 12. After pattern-etching, a plurality of second grooves 19 are formed on the at least one electronic device 11, the optical emitter 16 and the optical receiver 17. At last, through the second grooves 19, a plurality of metal pads 20 are formed on the at least one electronic device 11, the optical emitter 16 and the optical receiver 17 for inputting and outputting electronic signals.

In FIG. 2, a second preferred embodiment comprises the following steps:

(a2) A Si substrate 30 is provided. At least one electronic device 31 and a polycrystalline Si layer 32 are formed on the Si substrate 30. A first insulating layer 33 is covered on the Si substrate 30, the at least one electronic device 31 and the polycrystalline Si layer 32. Therein, the Si substrate 30 can be a polycrystalline Si substrate.

(b2) The first insulating layer 33 is pattern-etched to form a first groove 34 on the polycrystalline Si layer 32. An active-layer semiconductor 35 is formed in the first groove and on the first insulating layer 33. Then, the active-layer semiconductor 35 is covered with a second insulating layer 37. Therein, a material of III-V group or IV group is used to fabricate the active-layer semiconductor 35; and, the melting point ($T_{melt}$) of the second insulating layer 37 is greater than that of the active-layer semiconductor 35.

(c2) By using RMG, the active-layer semiconductor 35 comprises a filling part 35a and a waveguide part 35b after an annealing process, where the filling part 35a is located in the first groove 34; and where the waveguide part 35b is located on the first insulating layer 33 and perpendicularly connected with the filling part 35a. Thus, a single crystal or alloy layer is formed on the polycrystalline Si layer 32 and the at least one electronic element 31. The waveguide part 35b is pattern-etched until the first insulating layer 33 to form an opening 36 upon the first insulating layer 33. Then, in the waveguide part 35b at both sides of the opening 36, an optical emitter 38 and an optical receiver 39 are formed. A third insulating layer 40 is covered on the optical receiver 38 and the optical emitter 39. Then, a passive optical waveguide layer 41 is formed on the third insulating layer 40, where the passive optical waveguide layer 41 is extended to and overlapped on a part of the optical emitter 38 and the optical receiver 39.

(d2) Then, a fourth insulating layer 42 is formed to be covered on the third insulating layer 40 and the passive optical waveguide layer 41. After pattern-etching, a plurality of second grooves 43 are formed on the at least one electronic device 31, the optical emitter 38 and the optical receiver 39. At last, through the second grooves 43, a plurality of metal pads 44 are formed on the at least one electronic device 31, the optical emitter 38 and the optical receiver 39 for inputting and outputting electronic signals. Therein, the passive optical waveguide layer 41 is made of amorphous Si (a-Si), Si nitride (SiN), Si oxynitride (SiON) or a material having a refractive index greater than the third and the fourth insulating layers 40,42.

Thus, a novel method of integrating all active and passive optical devices on a Si-based IC is obtained.

Figure 3:
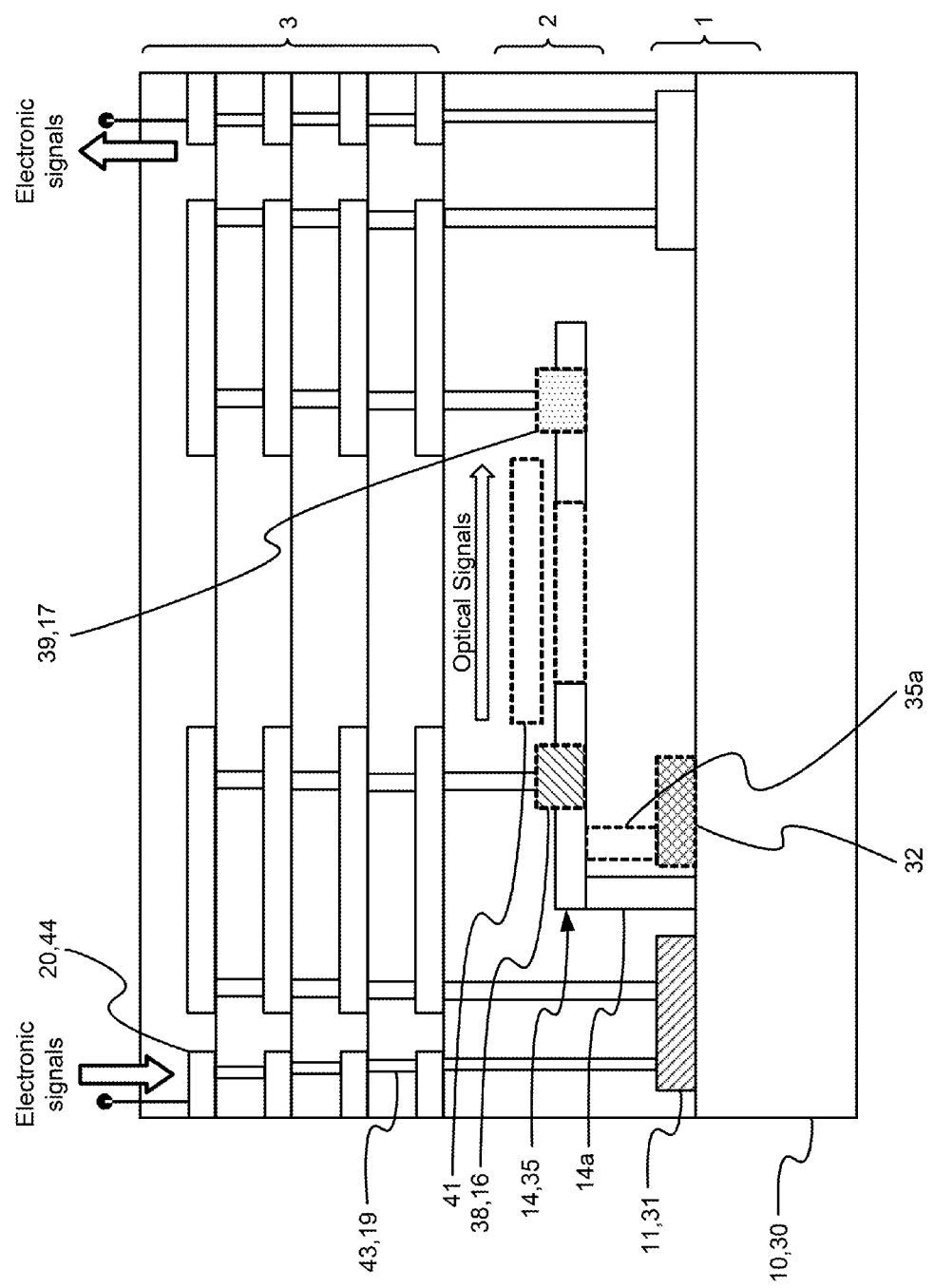
FIG. 3 is the view showing the state-of-use of the present invention.

Please refer to FIG. 3, which is a view showing a state-of-use of the present invention. As shown in the figure, the first and second preferred embodiments shown in FIG. 1 and FIG. 2 are integrated together. On using the present invention, electronic signals are inputted from a metal pad at a side; and, through a waveguide part of an active-layer semiconductor in between, the signals are passed to another metal pad at another side to be received.

The present invention integrates a light source, optical passive devices, optical detectors and electronic circuits on a standard Si substrate through a producing procedure of CMOS. In FIG. 3, a CMOS circuit 1 is set on a Si substrate 10,30; an optoelectronic IC 2 is set in the middle made of the active-layer semiconductor 14,35; and, signals are inputted and outputted by the metal pads 20,44, where a plurality of metal linking layers 3 are set for transferring the signals. The present invention uses RMG to form a layer of a single crystal or an alloy for obtaining compatibility to general CMOS producing procedures. The key technology is that the activation temperature for Si-doping (950 to 1100 degrees) and the temperature for RMG (>937 degrees) are similar. Hence, processes of bottom-transistor activation and thin-film epitaxy of electronic devices are finished within a few seconds. These two steps can be integrated to be performed together for minimizing thermal budget. Thus, the present invention replaces the SOI substrate with a Si substrate for effectively reducing cost and improving heat dissipation; uses RMG to solve the problem on integrating electronic circuits and optoelectronic devices for developing proactive optical transceivers; and integrates circuits to obtain a compatible and fully integrated optical communication chip.

To sum up, the present invention is a method of integrating all active and passive optical devices on a Si-based IC, where a light source, optical passive devices, optical detectors and electronic circuits are integrated on a standard Si substrate through a producing procedure of CMOS for effectively reducing cost and improving heat dissipation; RMG is used to solve the problem on integrating electronic circuits and opto-electronic devices for developing proactive optical transceivers; and circuits are integrated to obtain a compatible and fully integrated optical communication chip.

The preferred embodiments herein disclosed are not intended to unnecessarily limit the scope of the invention. Therefore, simple modifications or variations belonging to the equivalent of the scope of the claims and the instructions disclosed herein for a patent are all within the scope of the present invention.

What is claimed is:

1. A method of integrating all active and passive optical devices on a silicon (Si)-based integrated circuit (IC), comprising steps of:
   (a1) providing a Si substrate; obtaining at least one electronic device on said Si substrate; and obtaining a first insulating layer to be covered on said Si substrate and said at least one electronic device;
   (b1) pattern-etching said first insulating layer to form a first groove on said Si substrate; obtaining an active-layer semiconductor in said first groove and on said first insulating layer; and obtaining a second insulating layer to be covered on said active-layer semiconductor;
   (c1) by using rapid melt epitaxy (RMG), said active-layer semiconductor comprising a filling part and a waveguide part after an annealing process to obtain a layer of a material selected from a group consisting of a single crystal and an alloy on said Si substrate and said at least one electronic device, said filling part being located in said first groove, said waveguide part being located on said first insulating layer and perpendicularly connected with said filling part; and obtaining an optical emitter and an optical receiver; and
   (d1) obtaining a third insulating layer to be covered on said optical emitter, said optical receiver, said waveguide part and said first insulating layer; after pattern-etching, obtaining a plurality of second grooves on said at least one electronic device, said optical emitter and said optical receiver; through said second grooves, obtaining a plurality of metal pads on said at least one electronic device, said optical emitter and said optical receiver to input and output electronic signals.

2. The method according to claim 1, wherein said Si substrate is a polycrystalline Si substrate.

3. The method according to claim 1, wherein a material selected from a group consisting of III-V group and IV group is used to fabricate said active-layer semiconductor.

4. The method according to claim 1, wherein said second insulating layer has a melting point greater than that of said active-layer semiconductor.

5. A method of integrating all active and passive optical devices on a Si-based IC, comprising steps of:
   (a2) providing a Si substrate; obtaining at least one electronic device and a polycrystalline Si layer on said Si substrate; and obtaining a first insulating layer to be covered on said Si substrate, said at least one electronic device and said polycrystalline Si layer;
   (b2) pattern-etching said first insulating layer to obtain a first groove on said polycrystalline Si layer; obtaining an active-layer semiconductor in said first groove and on said first insulating layer; and obtaining a second insulating layer to be covered on said active-layer semiconductor;
   (c2) by using RMG, said active-layer semiconductor comprising a filling part and a waveguide part after an annealing process, said filling part being located in said first groove, said waveguide part being located on said first insulating layer and perpendicularly connected with said filling part; obtaining a layer of a material selected from a group consisting of a single crystal and an alloy; pattern-etching said layer of said material until said first insulating layer; separately obtaining an optical emitter and an optical receiver on said waveguide part separated; obtaining a third insulating layer to be covered on said optical emitter and said optical receiver; and obtaining a passive optical waveguide layer on said third insulating layer; and
   (d2) obtaining a fourth insulating layer to be covered on said third insulating layer and said passive optical waveguide layer; after pattern-etching, obtaining a plurality of second grooves on said at least one electronic device, said optical emitter and said optical receiver; through said second grooves, obtaining a plurality of metal pads on said at least one electronic device, said optical emitter and said optical receiver to input and output electronic signals.

6. The method according to claim 5, wherein said Si substrate is a polycrystalline Si substrate.

7. The method according to claim 5, wherein a material selected from a group consisting of III-V group and IV group is used to fabricate said active-layer semiconductor.

8. The method according to claim 5, wherein said second insulating layer has a melting point greater than that of said active-layer semiconductor.

9. The method according to claim 5, wherein said passive optical waveguide layer is made of a material selected from a group consisting of amorphous Si (a-Si), Si nitride (SiN), Si oxynitride (SiON) and a material having a refractive index greater than said third and said fourth insulating layers.

10. The method according to claim 5, wherein said passive optical waveguide layer is extended to and overlapped on a part of said optical emitter and said optical receiver.

* * * * *